United States Patent
Janos

[11] Patent Number: 5,980,638
[45] Date of Patent: Nov. 9, 1999

[54] DOUBLE WINDOW EXHAUST ARRANGEMENT FOR WAFER PLASMA PROCESSOR

[75] Inventor: Alan C. Janos, East Windsor, N.J.

[73] Assignee: Fusion Systems Corporation, Rockville, Md.

[21] Appl. No.: 08/790,554

[22] Filed: Jan. 30, 1997

[51] Int. Cl.⁶ .................................................. C23C 16/00
[52] U.S. Cl. ........................... 118/715; 118/715; 156/345
[58] Field of Search ............................. 156/345; 118/715, 118/724, 725, 723 MW, 723 ME

[56] References Cited

U.S. PATENT DOCUMENTS

| | | |
|---|---|---|
| 4,609,426 | 9/1986 | Ogawa et al. . |
| 4,640,224 | 2/1987 | Bunch et al. . |
| 4,703,718 | 11/1987 | Enstrom . |
| 4,823,734 | 4/1989 | Christin . |
| 4,836,902 | 6/1989 | Kalnitsky et al. . |
| 4,854,263 | 8/1989 | Chang et al. . |
| 4,867,544 | 9/1989 | Bornstein et al. . |
| 4,963,393 | 10/1990 | Goela et al. . |
| 5,091,207 | 2/1992 | Tanaka . |
| 5,156,820 | 10/1992 | Wong .................................. 422/186.05 |
| 5,158,644 | 10/1992 | Cheung et al. . |
| 5,275,629 | 1/1994 | Ajika et al. . |
| 5,441,568 | 8/1995 | Cho et al. . |
| 5,468,298 | 11/1995 | Lei et al. . |
| 5,487,785 | 1/1996 | Horiike et al. . |
| 5,558,717 | 9/1996 | Zhao et al. . |
| 5,580,421 | 12/1996 | Hiatt ..................................... 150/643.1 |
| 5,582,866 | 12/1996 | White . |
| 5,593,541 | 1/1997 | Wong .................................. 156/643.1 |
| 5,645,646 | 7/1997 | Beinglass et al. . |

FOREIGN PATENT DOCUMENTS

| | | |
|---|---|---|
| 0 669 640 | 8/1995 | European Pat. Off. . |
| 0 786 804 | 7/1997 | European Pat. Off. . |

OTHER PUBLICATIONS

Patent Abstracts of Japan, vol. 014, No. 502 (E–0997), Nov. 2, 1990 and JP 02 208927 A (Mitsubishi Electric Corp), Aug. 2, 1990, see abstract.
Patent Abstracts of Japan, vol. 011, No. 294 (E–544), Sep. 22, 1987 and JP 62 094925 A (NEC Corp), May 1, 1987.

*Primary Examiner*—Bruce Breneman
*Assistant Examiner*—Erin Fieler
*Attorney, Agent, or Firm*—Pollock, Vande Sande & Amernick, R.L.L.P.

[57] ABSTRACT

A plasma ashing chamber that uses an external radiant power source to uniformly heat the wafer is provided with a double plate window through which radiant heat and exhaust gases flow without interfering with each other.

14 Claims, 6 Drawing Sheets a
DOUBLE WINDOW EXHAUST ARRANGEMENT FOR WAFER PLASMA PROCESSOR

FIELD OF THE INVENTION

This invention pertains to chambers for processing semiconductor wafers.

BACKGROUND

Single wafer processing machines are increasingly being used in semiconductor fabrication facilities. One reason for this is to maximize control over the processing conditions. Processing conditions are often constituted by the temperature, intensity of radiant energy flux (e.g. ultraviolet or infrared), and/or the flux of atomic or molecular species (e.g. etchant)impinging the wafer. Another justification for using single wafer processing machines is to increase the uniformity of the processing conditions over the surface of the wafer. This is necessary so that each die produced from the wafer will have similar acceptable electrical performance characteristics, regardless of the part of the wafer from which it was cut. In this regard, it should be noted that holding the process conditions uniform over the entire wafer becomes more difficult as the wafer size increases according to the continuing trend in the semiconductor industry.

Certain processes require simultaneous application of radiant energy and reacting species to the wafer. For example, in conducting plasma ashing to remove used photoresist, heating radiation (e.g. infrared and visible light) is applied to the wafer through a window in the chamber and at the same time oxygen which has been excited by flowing it through a microwave plasma discharge is passed over the wafer. In this process the oxygen in an excited state reacts with the heated photoresist borne on the wafer, thereby removing it by oxidizing it into gaseous (e.g. $CO_2$ and $H_2O$), and volatile low molecular weight products which are exhausted from the chamber through an exhaust orifice. Thus, in this process there is a need to achieve uniform heating radiation intensity over the wafer and uniform flux of excited oxygen reactants over the wafer.

FIG. 1 shows a schematic representation of a prior art plasma asher such as manufactured by Fusion Systems Corporation of Rockville, Md., the assignee of the instant invention. Referring to FIG. 1, gas is supplied from gas supply 1, and flows in conduit 4, through microwave exciter 2. The microwave exciter 2, as known in the art, may take the form of a microwave cavity with a gas conduit 4 passing through it. The gas is formed into a plasma as it flows in to the exciter. Microwave power from microwave generator 3 is fed (e.g. by a waveguide or by direct magnetron antenna coupling) into the microwave exciter to power the plasma. From the exciter the gas, which by action of the plasma excitation, has been chemically activated, flows into the wafer processing chamber, 5. The processing chamber 5, comprises upper, 6a and lower 6b inlet baffle plates, which serve to spread the flow of the reactive gas in order to make it more uniform. The baffle plates 6a, 6b have a symmetric arrangement of orifices as known in the art. Downstream, and below the lower inlet baffle plate 6b, the wafer 7 undergoing processing is positioned horizontally. The wafer is supported by three quartz standoffs 8 (two shown) above the lower wall 9 of the processing chamber. The lower wall, 9 also serves as a radiant energy window through which radiant heating power from incandescent bulbs 10a, 10b passes. Although only two bulbs 10a, 10b are shown in this schematic depiction, in actuality several arranged in a circle are used. The lower wall, 9 may be made of quartz glass and must be of sufficient thickness to bear the external ambient pressure when the chamber is operated under vacuum. The lower chamber wall 9 comprises a central orifice 9a. Upper exhaust pipe section 11a is also made of quartz, and is fused to the central orifice 9a of the lower chamber wall 9. Lower exhaust pipe section 11b is connected to a vacuum pump system 12. The central location of central orifice 9a is important because it contributes, along with arrangement of the baffle plates 6a, 6b to establishing a symmetrical flow of process gas in the processing chamber 5.

However the central location of the central orifice 9a, which requires the central location of upper exhaust pipe section 11a, causes difficulties in achieving uniform radiant power distribution over the wafer 7. The location of the upper exhaust pipe section 11a, interferes with the placement of radiant power sources and optics, and thereby prevents uniform distribution of radiant power over the surface of the wafer. Two examples which represent two known ways of achieving uniform irradiance over a plane, in this case the wafer, which are precluded by the presence of upper exhaust pipe section, 11a in the above described prior art processor, but which can be used according to the invention, as will be disclosed below, are the multiple variable control, multizone planar array illuminator approach, hereinafter referred to simply as "planar array", and the approach of using a custom designed surface of revolution reflector in combination with a single high powered source.

The planar array approach is precluded in the prior art processing chamber described above because it is a essential that the central lamp in the array be located directly below the center of the wafer. This cannot be arranged because the upper section 11a of the exhaust pipe passes through this location.

The surface of revolution reflector approach is precluded because the single high powered source used in this approach must be located directly below the center of the wafer, and as in the former planar array case this can not be arranged.

SUMMARY OF THE INVENTION

According to the present invention, a wafer processing chamber which has a wafer treatment gas flowing through the chamber and radiant energy passing into the chamber, is provided with a double bottom wall assembly, comprising upper and lower bottom walls (hereinafter "upper and lower walls"). The upper wall has a central orifice. The peripheral wall of the chamber between the upper and lower walls is provided with a plurality of high fluid conductance, and/or symmetrically arranged orifices. Each branch connects to a branch of an exhaust manifold. The branches have high fluid conductance and/or at least approximately equal fluid conductance, so that the exhaust flow through the plurality of orifices will be equal. The arrangement of the exhaust manifold will be such that the space below bottom of the chamber is free and clear of obstruction, thereby permitting a radiant heating system to be installed in this space. At least, the planar array type or the axisymetric reflector type mentioned in the background could be used. The foregoing is not to be construed as limiting, on the contrary, numerous other ways are known in the art for obtaining some degree of uniformity over a wafer. In this connection it should be pointed out that in practice no systems achieve perfect uniformity. Both bottom walls are substantially transparent, to a type of radiant energy which is passed into the chamber through the double bottom wall assembly. The wall assembly thereby provides an unobstructed view of the wafer from the position of the radiant energy sources. Gas being exhausted from the chamber flows through the central orifice in the upper wall and out the orifices in the peripheral wall between the upper and lower walls.

It is an advantage of this invention to provide a wafer processing chamber which provides improved optical access to a wafer inside the chamber.

It is a further advantage of the invention to provide a wafer processing chamber which may be used to uniformly illuminate a wafer.

It is a further advantage of the invention that a symmetrical flow of process gas in the chamber may be provided.

DETAILED DESCRIPTION OF THE PREFERRED EMBODIMENTS

Referring to the Figures, an exposition of the preferred embodiments will now be given.

Figure 1:
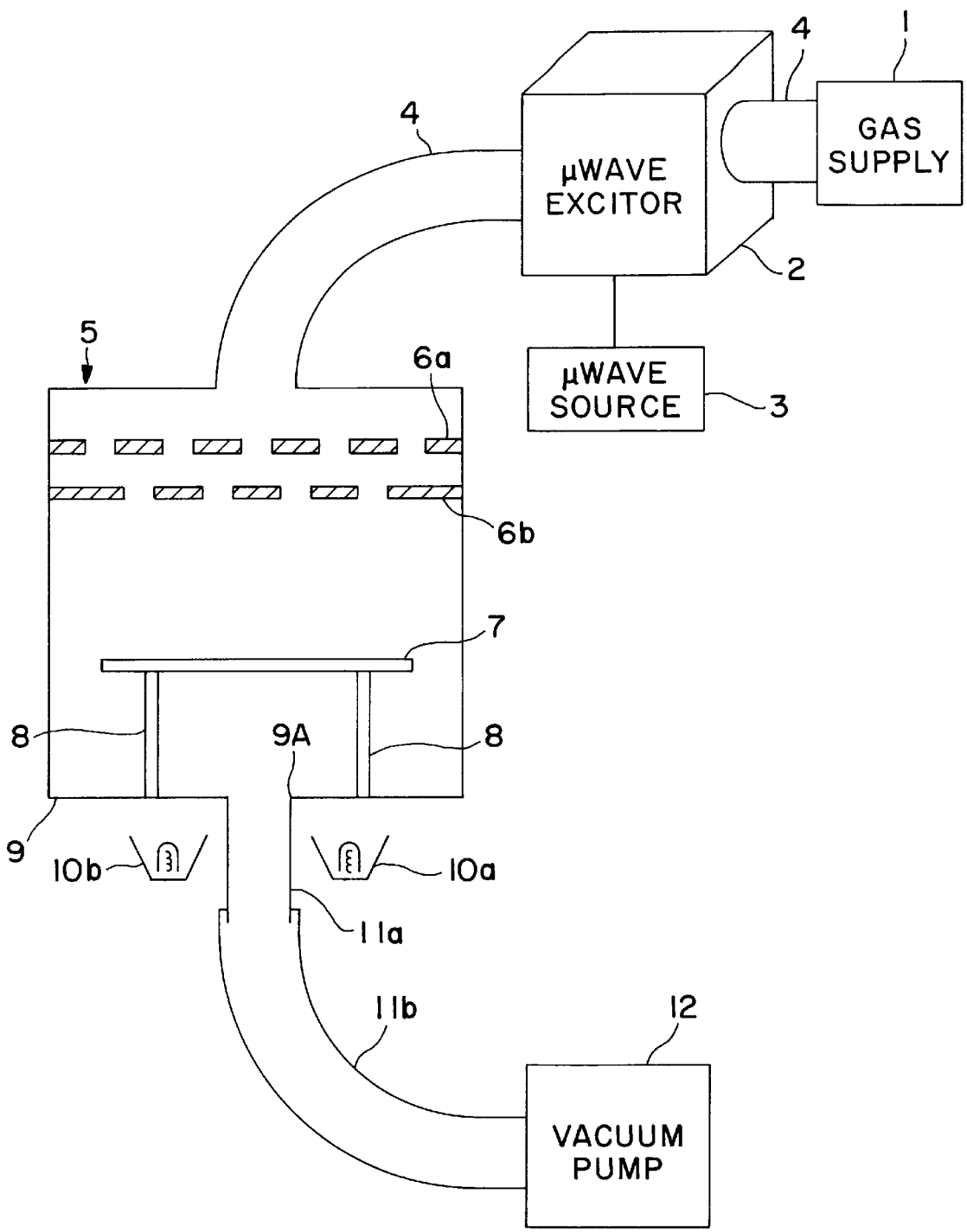
FIG. 1 is a schematic representation of a prior art plasma processing machine
Figure 2:
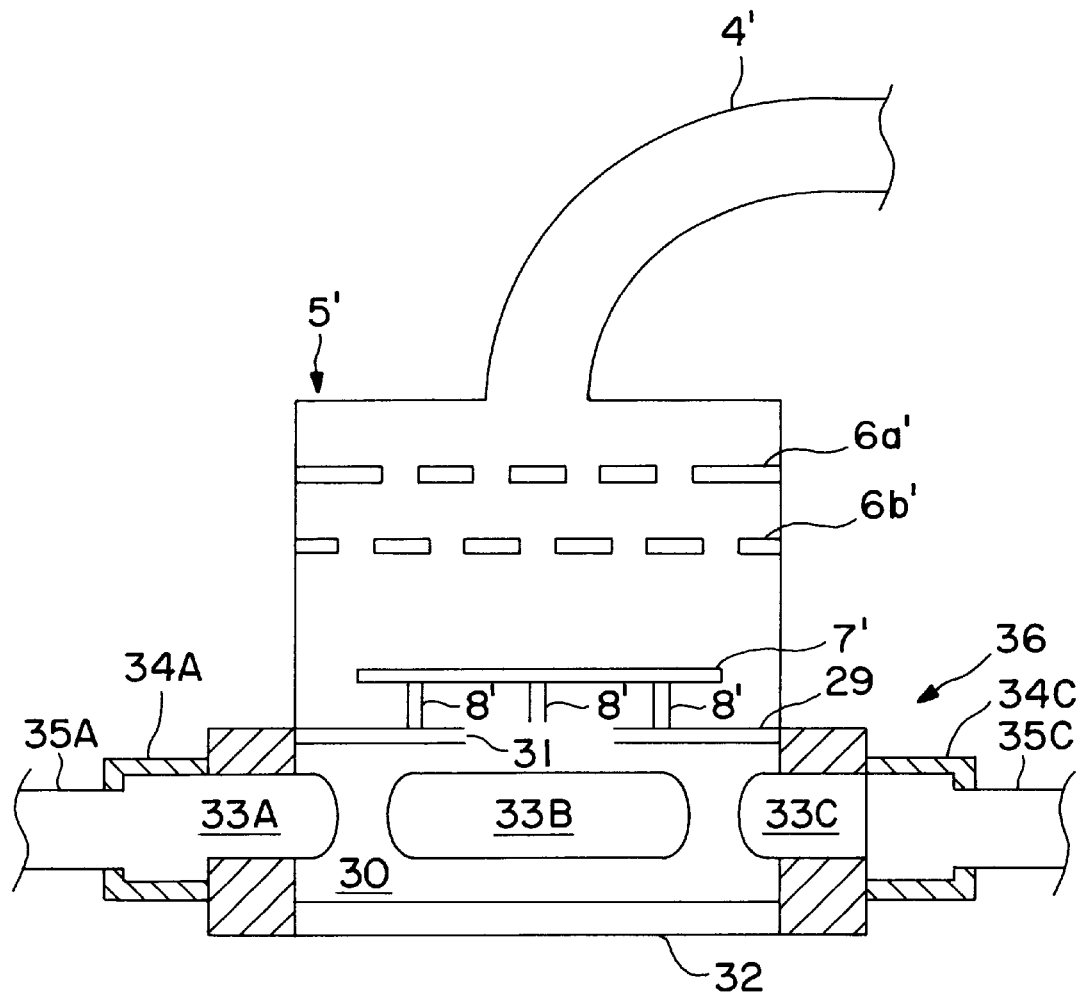
FIG. 2 is a schematic sectional elevation of a plasma processing chamber according to the preferred embodiment of this invention.
Figure 3:
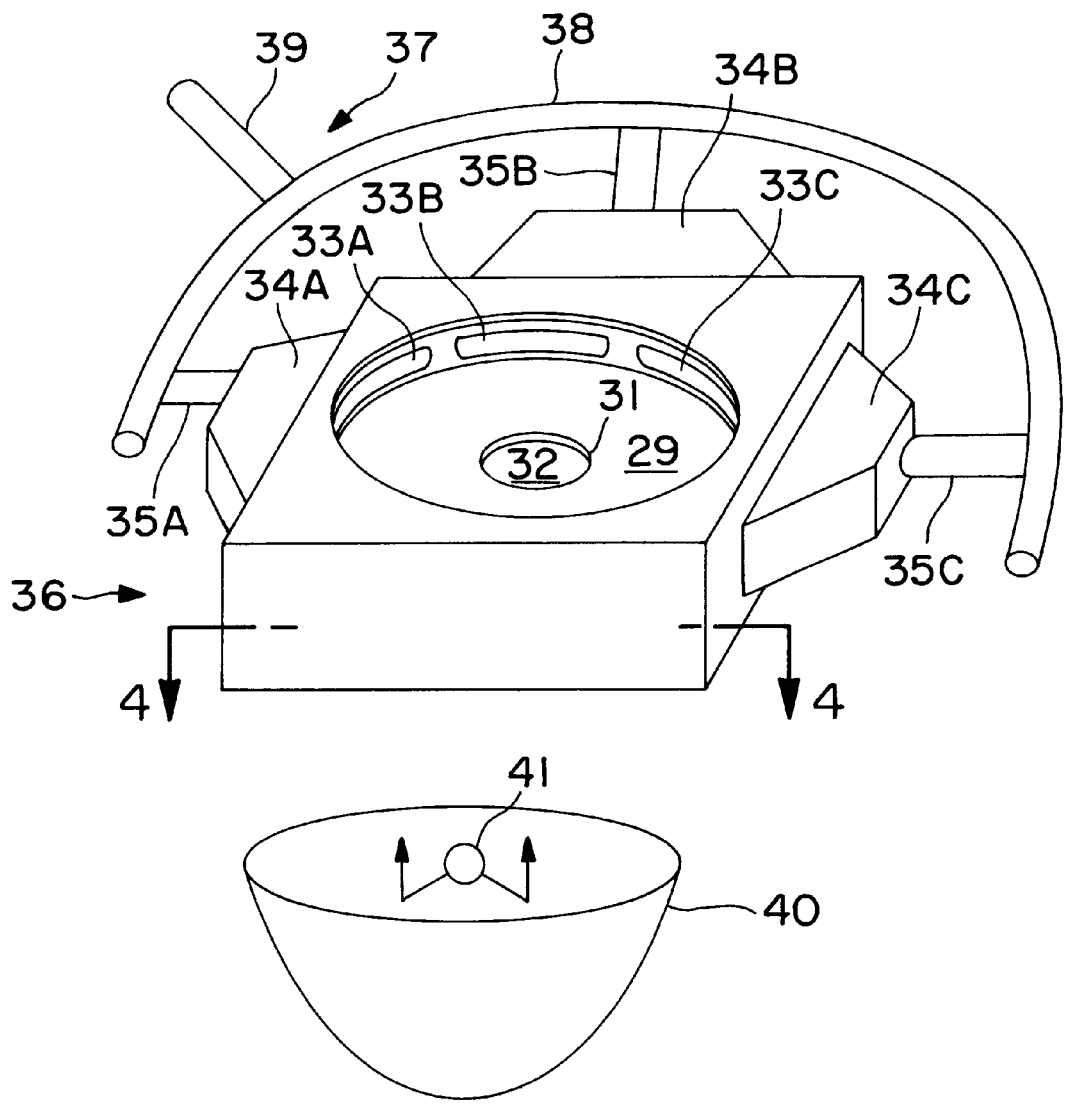
FIG. 3 is a perspective view of the bottom wall assembly of the plasma processing chamber shown in FIG. 2 along with an attached exhaust manifold.
Figure 4:
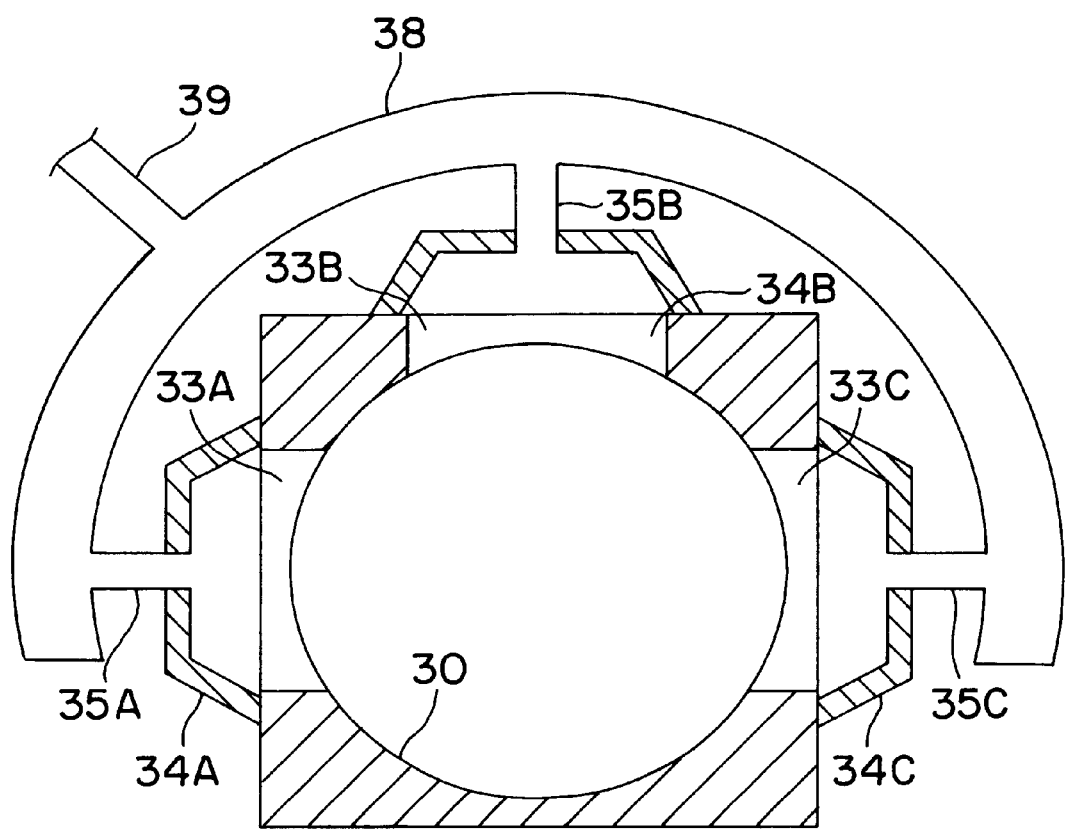
FIG. 4 is a sectional plan view of the bottom wall assembly shown in FIG. 3.

FIGS. 2, 3, and 4 depict the preferred embodiment of the invention. Referring to these Figures, it will be seen that the upper parts of the chamber are the same as in the prior art processing chamber shown in FIG. 1, and are denoted with like numerals. Thus, inlet pipe 4' conducts gas from microwave exciter, (not shown in this Figure) into the processing chamber 5'. Inlet baffle plates 6a', 6b', act to spread out the flow of excited process gas over the wafer, which is supported on quartz standoffs 8'.

The bottom wall assembly 36 of the chamber according to the invention will now be described. Beneath the wafer, is upper wall 29. The wafer is supported by the interceding standoffs 8' on the upper wall 29. The upper wall 29 is transparent to heating radiation which passes through it. The upper wall 29 has a central orifice 31 through which exhaust flow passes on the way out of the processor 5'. The central location of the central orifice 31 contributes along with the inlet baffle plates 6a', 6b' to determine a symmetric and hence more uniform flow of process gas over wafer 7', which in turn results in more uniform processing. The upper wall 29 need not be too thick since it is not subject to the full pressure difference between the interior of the processing chamber and the ambient pressure outside the processing chamber. Since the upper wall may be thin, the bulk absorption losses of the heating radiation passing through it will be small. Below upper wall 29 is lower wall 32. The lower wall is a simple circular window with no obstruction or orifice and is of sufficient thickness to sustain the difference between the pressure in the processing chamber 5' and the ambient pressure. It is also transparent to heating radiation which passes through it towards wafer 7'. Extending between the peripheral edges of the upper and lower plates 29, 32 is circumferential wall 30, which serves to close off the space between them. There are three relatively large, high fluid conductance exhaust ports 33A, 33B, 33C in the circumferential wall 30. After passing through central orifice 31 in the upper plate 29, the spent process gas diverges and flows out of exhaust ports 33A, 33B, 33C. Couplers (two visible in FIG. 2) 34A, 34B, 34C connect to the exhaust ports 33A, 33B, 33C. The couplers 34A, 34B, 34C serve to transition the flow from exhaust ports 33A, 33B, 33C into an exhaust conduit means, e.g., a manifold, as will be described below.

Referring, in particular, to FIG. 3, a perspective view of the bottom wall assembly 36 of the plasma processing chamber 5' is shown along with an attached exhaust manifold 37. The exhaust manifold 37, comprises three short branch pipes 35A, 35B, 35C which connect respectively to couplers 34A, 34B, 34C. The short branch pipes 35A, 35B, 35C are connected to plenum pipe 38 which runs in an arc of about 270 degrees around lower wall assembly 36. Plenum pipe 38 is in turn connected to main collector pipe 39. The main collector pipe is in turn connected to a vacuum pump (not shown).

This design of the exhaust manifold leaves the space beneath lower plate 32 free of obstruction, so that a radiant power source (e.g. lamp system) 40, 41 can be placed in that space and an unobstructed view from that position to the wafer 7 can be obtained through the bottom wall assembly 36.

Preferably, the area of the central orifice will be chosen so that the pressure drop across the central orifice 31 is large in comparison to the pressure drop from immediately past the orifice to the vacuum pump. The fluid conductance in the exhaust path can then be readily adjusted by adjusting the area of the central orifice 31 so long as the conductance of the latter is kept comparatively low. In this case the fluid conductance of the exhaust ports 33A, 33B, 33C, couplers 34A, 34B, 34C, short branch pipes, 35A, 35B, 35C, plenum pipe 38, and collector pipe 39 is high, but need not be precisely equal, in order to obtain a substantially symmetric flow of exhaust gases through the chamber 5' and out the central orifice 31.

On the other hand, if it is desired to maximize the overall conductance of the system between the gas supply and the vacuum system it may be necessary to enlarge the central orifice 31 to increase its conductance, increase the internal diameters of the collector pipe 39 and plenum pipe 38, but to decrease and adjust (e.g. equalize) the conductances of short branch pipes 35A, 35B, 35C. The latter alteration somewhat decreases the overall system conductance but preserves the symmetry of the flow through central orifice 31. The adjustment may be accomplished by routine experimentation in which the conductances of pipes 35A, 35B, 35C are varied until the flow of processing gas in the chamber is observed to be symmetric as judged by comparing the ashing rate for portions of the wafer nearest to the three pipes. A low ashing rate would indicate a low flow on that side, and the conductance of the pipe on that side would then be increased relative to the others.

In either case the conductance and placement of the three exhaust ports 33A, 33B, 33C need not be symmetrical. Since the placement of the exhaust ports 33A, 33B, 33C need not be symmetrical, they can be arranged on three sides of the processing chamber 5', leaving the fourth side open to allow placement of a chamber door (not shown) and/or otherwise provide access to the chamber on the fourth side.

A radiant power system comprising a source of radiant energy such as a microwave powered electrode less lamp and a surface of revolution reflector is arranged to uniformly irradiate the wafer 7 located in the processing chamber 5' through upper plate 29 and lower plate 32. U.S. Pat. No. 4,683,525 to Camm which teaches a surface of revolution reflector capable of achieving relatively uniform intensity over a plane area, is hereby incorporated herein by reference.

Figure 5:
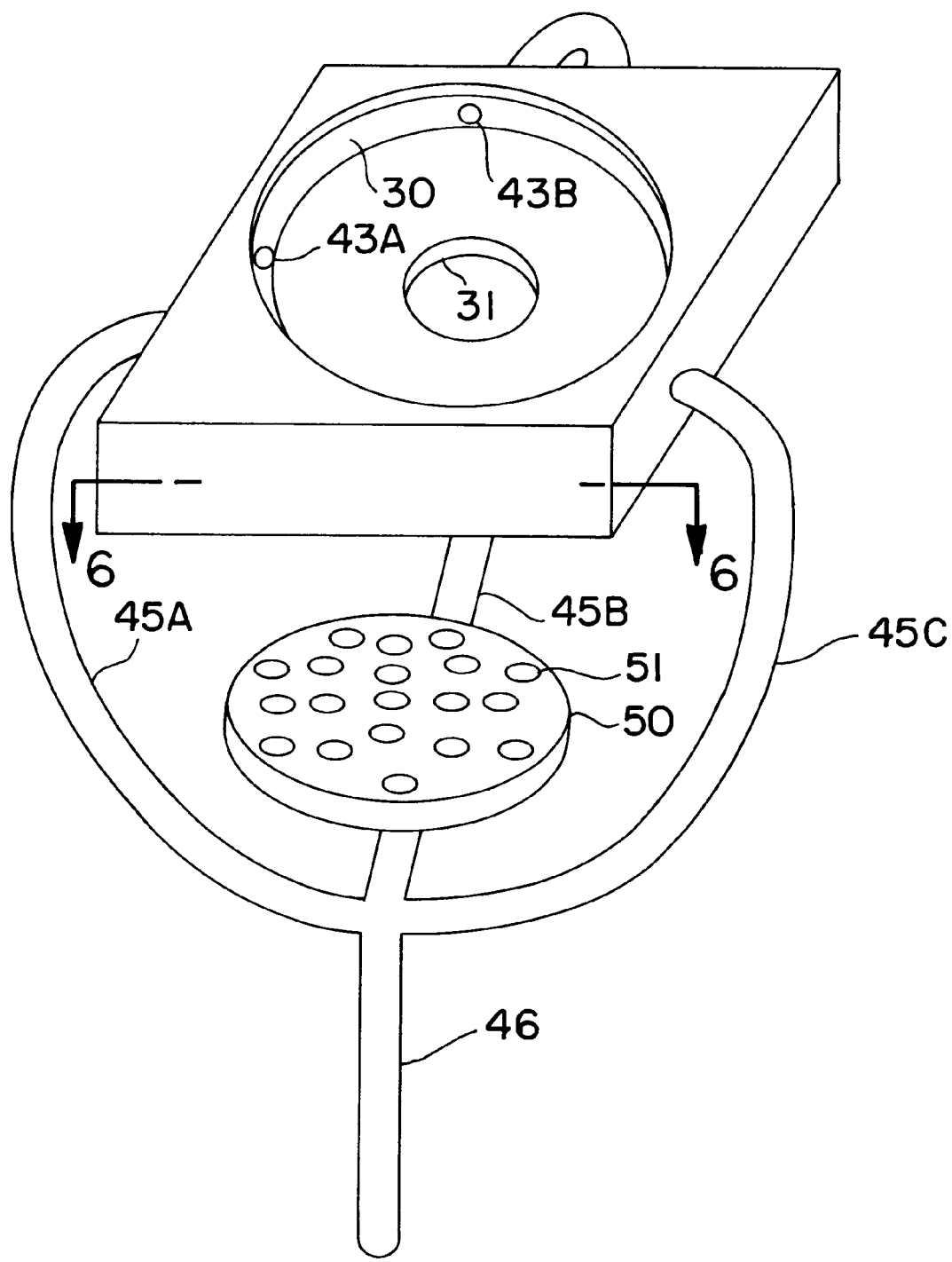
FIG. 5 is a perspective view of the bottom wall assembly of a plasma processing chamber according to a second embodiment of the invention
Figure 6:
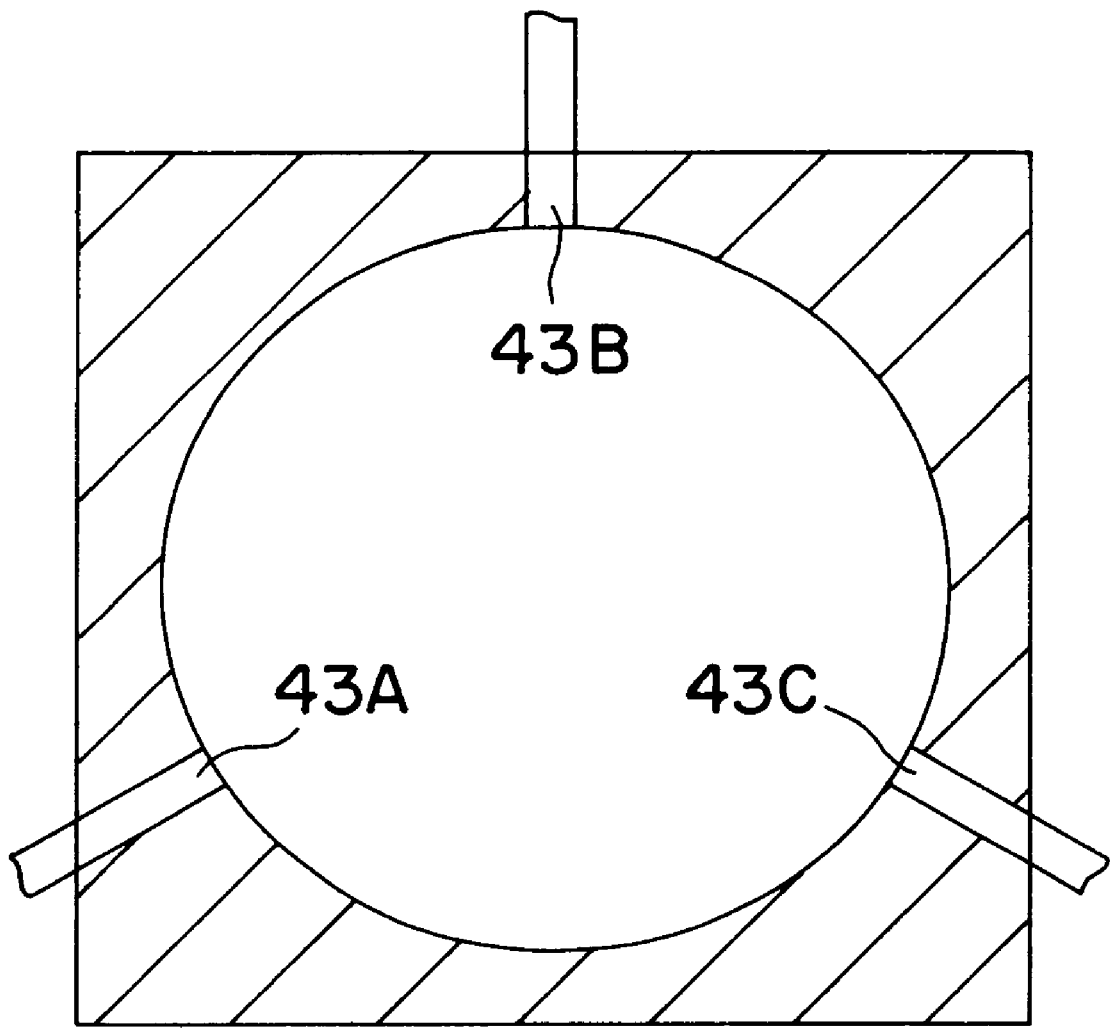
FIG. 6 is a sectional plan view of the bottom wall assembly shown in FIG. 5.

FIGS. 5 and 6 depict an alternative embodiment of the invention. FIG. 5 depicts an alternative bottom wall assembly, exhaust plenum, and radiant energy source.

In this embodiment, three exhaust ports 43A, 43B, 43C are symmetrically located 120 degrees apart on peripheral wall 30. These ports are connected to three equal length branch pipes 45A, 45B, 45C, which converge and connect to a main collector pipe 46, which is connected to a vacuum pump (not shown). The symmetrical arrangement of the pump ports 43A, 43B, 43C and the equal conductances of the branch pipes 45A, 45B, 45C allows branch pipes of lower conductance to be used while still obtaining relatively symmetrical flow of exhaust gas at central orifice 31. Having central exhaust gas flow at central orifice 31 contributes to having a symmetric and hence, more uniform flow of process gas within processing chamber 5'.

The radiant power source 50 in this embodiment comprises a planar array of lamps 51, which, for example, may be tungsten halogen lamps. In the planar array, one lamp is centrally located. Additionally, the lamps may be segregated into separately powered groups, and the power of the different groups may be controlled so as to create a uniform radial temperature profile over the wafer. The exact techniques for controlling the lamps in such an arrangement are well known in the art.

It should be appreciated that variations of the foregoing may occur to those skilled in the art without departing from the spirit and scope of the present invention. Hence, the invention is to be defined by the claims appended hereto and equivalents thereof.

I claim:

1. A processing chamber for treating a semiconductor wafer with a gas comprising, a first wall, an exhaust orifice in said first wall, a second wall, said second wall forming a barrier to atmospheric pressure outside said processing chamber, a third wall peripheral to said first and second walls, interposed between said first and second walls, means for supporting a semiconductor wafer on the side of the first wall which is away from said second wall, and at least one exhaust port in said peripheral wall.

2. The processing chamber according to claim 1 wherein said chamber is also for exposing said semiconductor wafer to a type of radiant energy, and wherein said first and second walls are substantially transparent to said type of radiant energy.

3. The processing chamber of claim 2 wherein said orifice in said first wall is centrally located.

4. The processing chamber of claim 3 wherein the means for supporting the semiconductor wafer comprises a plurality of standoffs which rest on said first wall.

5. The processing chamber of claim 4 wherein said gas contains reactive species originated by a plasma.

6. The processing chamber according to claim 3 wherein said at least one exhaust port comprises a plurality of ports around said third wall which are configured to promote symmetrical flow of gas within said chamber.

7. The processing chamber according to claim 6 wherein said exhaust ports are connected to exhaust conduit means, and wherein said ports and conduit means have a higher fluid conductance than that of said exhaust orifice in said first wall.

8. The processing chamber of claim 7 wherein each exhaust port is relatively large, and thereby occupies a substantial portion of the peripheral wall.

9. The processing chamber of claim 8 wherein the shape of each exhaust port is such that it is elongated in the circumferential direction of the peripheral wall.

10. The processing chamber according to claim 9 wherein said exhaust conduit means comprises an exhaust manifold having a plurality of branch pipes connected to said plurality of ports.

11. The processing chamber according to claim 10 wherein said plurality of branch pipes have equal fluid conductances.

12. The processing chamber of claim 4 wherein said first and second walls are substantially parallel to each other.

13. A processing apparatus for treating a semiconductor wafer with a gas and a type of radiant energy comprising, a first wall which is substantially transparent to said type of radiant energy, having a centrally located orifice, a second wall which is substantially transparent to said type of radiant energy forming a barrier to atmospheric pressure, a third wall between said first and second walls which is peripheral thereto, means for supporting a semiconductor wafer on the side of said first wall which is away from said second wall in such manner that said wafer is separated from said first wall, and exhaust means in said third wall which is configured to promote symmetrical flow of gas in said apparatus.

14. The apparatus of claim 13 wherein said exhaust means has a higher fluid conductance than the orifice in said first wall.

* * * * *